United States Patent
Park

(10) Patent No.: US 8,252,660 B2
(45) Date of Patent: Aug. 28, 2012

(54) FLASH MEMORY DEVICE AND METHOD OF MANUFACTURING THE SAME

(75) Inventor: Sung Kee Park, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 295 days.

(21) Appl. No.: 12/649,572

(22) Filed: Dec. 30, 2009

(65) Prior Publication Data

US 2010/0181609 A1   Jul. 22, 2010

(30) Foreign Application Priority Data

Jan. 21, 2009 (KR) .................. 10-2009-0005063

(51) Int. Cl.
 *H01L 21/76* (2006.01)
(52) U.S. Cl. .. 438/427; 438/405; 438/424; 257/E21.546
(58) Field of Classification Search ........... 257/E21.545, 257/E21.546, E21.553; 438/405, 424, 427, 438/433
See application file for complete search history.

(56) References Cited

U.S. PATENT DOCUMENTS

2010/0155906 A1* 6/2010 Lee et al. .................. 257/623

FOREIGN PATENT DOCUMENTS

| JP | 2006-202986 A | 8/2006 |
| JP | 2008-202986 A | 9/2008 |
| KR | 10-0772900 | 10/2007 |
| KR | 10-0810414 | 2/2008 |
| KR | 10-2008-0061482 | 7/2008 |
| KR | 10-2010-0075205 | 7/2010 |

OTHER PUBLICATIONS

Korean-language Official Action issued Nov. 18, 2010, by the Korean Intellectual Property Office in connection with the Korean counterpart priority application No. 10-2009-0005063.

* cited by examiner

*Primary Examiner* — Matthew Landau
*Assistant Examiner* — Colleen E Snow
(74) *Attorney, Agent, or Firm* — Marshall, Gerstein & Borun LLP

(57) ABSTRACT

Disclosed herein are flash memory devices and methods of making the same. According to one embodiment, a flash memory device includes first trenches formed in a semiconductor substrate and arranged in parallel, second trenches discontinuously formed in the semiconductor substrate and arranged between the first trenches, first isolation structures respectively formed within the first trenches, second isolation structures respectively formed within the second trenches, and active regions defined by the first isolation structures and the second isolation structures.

13 Claims, 9 Drawing Sheets ized in one direction. The gate lines include the word lines WL to each of which the gates of the memory cells are coupled and the source select lines SSL to each of which the gates of the source select transistors are coupled. The source region is formed in the active region 5a between the source select lines SSL and is coupled to a source contact line SCT. Here, the area of the source region with which the source contact line SCT comes into contact is narrowed with semiconductor devices high integrated.

FIGS. 2A and 2B illustrate problems resulting from a reduction in the area of the source region.

Referring to FIG. 2A, when evaluating a probe test (PT) for testing reliability of a flash memory chip, if the chip has a good state, a drain current (Id) having a reference value or more must flow between the source and the drain in the flash memory chip of an erase state. That is, if the drain current (Id) is less than the reference value, the chip is determined to be a fail. Such a fail is caused by an increase in the contact resistance (Rc) of the source contact line and the source region according to a reduction in the area of the source region because of the high integration of semiconductor devices.

Referring to FIG. 2B, the contact resistance (Rc) of the source contact line and the source region can be further increased by the influence of oxide 15 which is locally formed between the junction of a semiconductor substrate and conductive layers 17, 15 constituting a source contact plug. Here, the oxide 15 may be formed between the barrier metal 15 and the junction in a process of forming a source contact hole by etching a dielectric interlayer protecting a gate line 11 and then forming the barrier metal 15. Influence of an alien substance, such as the oxide 15 formed at the interface of the source contact line and the source region in the process of manufacturing the flash memory device, on the performance of a device is increased with a reduction in the area of the active region.

FIG. 3 illustrates a problem resulting from a narrowed active region.

Referring to FIG. 3, with the high integration of semiconductor devices, the width of the active region 5a is much narrowed as compared to the height of the active region 5a. Furthermore, the active regions 5a are lengthily formed in one direction, as described above with reference to FIG. 1. Accordingly, the active regions 5a are vulnerable to external shock and stress, such as heat generated in subsequent processes, and so prone to bend as shown in a region A.

FLASH MEMORY DEVICE AND METHOD OF MANUFACTURING THE SAME

CROSS-REFERENCE TO RELATED APPLICATIONS

Priority to Korean patent application number 10-2009-0005063 filed on Jan. 21, 2009, the entire disclosure of which is incorporated by reference herein, is claimed.

BACKGROUND

1. Field of the Invention

One or more embodiments relate to a flash memory device and a method of manufacturing the same and, more particularly, to a flash memory device and a method of manufacturing the same, which are capable of increasing the area of an active region and improving a bend phenomenon of the active region.

2. Brief Description of Related Technology

The memory cell array of a flash memory device includes string structures arranged in a matrix form. Each of the string structures includes a drain select transistor having a drain coupled to a bit line, a source select transistor having a source coupled to a common source line, and a number of memory cells coupled in series between the drain select transistor and the source select transistor. The string structures are electrically isolated from each other by an isolation structure interposed therebetween. Gates of the string structures are arranged in parallel and are coupled to form gate lines. The gate lines include a drain select line to which the gates of the drain select transistors are coupled, a source select line to which the gates of the source select transistors are coupled, and word lines to each of which the gates of the memory cells are coupled. Such gate lines are formed by coupling the drain select transistor, the source select transistor, and the control gates of stacked gates included in the memory cells. The stacked gate has a stack structure of a floating gate, a dielectric layer, and the control gate.

Junctions are formed in the active regions of a semiconductor substrate defined on both sides of the gate. The active regions are defined by etching the semiconductor substrate to thus form trenches, and forming the isolation structures within the respective trenches. That is, the isolation structures are not formed in the active regions of the semiconductor substrate. Furthermore, the junctions include a cell junction, a source region, and a drain region. The memory cell gates within the same string structure are coupled through the cell junction, the gates of the source select transistors are coupled through the source region, and the gates of the drain select transistors are coupled through the drain region. Here, the source region and the drain region couple the unit string structures arranged in a line in the direction of the string. Further, the source regions arranged in parallel are coupled to a source contact line of a line form.

FIG. 1 is a layout diagram showing the active regions and the isolation regions of a known flash memory device.

Referring to FIG. 1, as described above, the string structures arranged in a line are coupled with the junction interposed therebetween, and the parallel string structures are isolated from each other with the isolation structure 3 interposed therebetween. To this end, in the cell region of the flash memory device, the isolation structures 3 and the active regions 5a are alternately defined in parallel, and each are lengthily defined in one direction without disconnection.

Meanwhile, the gate lines are formed to intersect the isolation structures 3 and the active regions 5a which are length-

BRIEF SUMMARY

One or more embodiments relate to a flash memory device and a method of manufacturing the same, which are capable of increasing the area of an active region and also improving a bend phenomenon of the active region.

According to an aspect of this disclosure, a flash memory device includes first trenches formed in a semiconductor substrate and arranged in parallel, second trenches discontinuously formed in the semiconductor substrate and arranged between the first trenches, first isolation structures respectively formed within the first trenches, second isolation structures respectively formed within the second trenches, and active regions defined by the first isolation structures and the second isolation structures.

A source region or a well pickup region is formed at the discontinuous region of the second trench.

According to another aspect of this disclosure, a method of manufacturing a flash memory device includes forming first and second trenches in a semiconductor substrate, wherein the first trenches are arranged in parallel, and the second trenches are discontinuously arranged between the first trenches, and forming first isolation structures within the respective first trenches and second isolation structures within the respective second trenches, thereby defining active regions by the first isolation structures and the second isolation structures.

According to one embodiment, the step of forming the first and second trenches in the semiconductor substrate preferably includes forming a number of first auxiliary patterns arranged in a matrix form over the semiconductor substrate. The matrix is defined by first auxiliary patterns that are spaced apart from each other at a first interval and are arranged in a same column, and first auxiliary patterns that are spaced apart from each other at a second interval and are arranged in a same row. The step also includes forming a second auxiliary pattern on sidewalls of each of the first auxiliary patterns, removing the first auxiliary patterns, etching the semiconductor substrate through an etch process using the second auxiliary patterns as an etch mask to form the first and second trenches, and removing the second auxiliary patterns.

The first interval preferably is at least 1.5 times a width of the first auxiliary pattern and no more than 2 times a width of the second auxiliary pattern.

The second interval is preferably wider than the first interval.

The second trenches preferably are arranged between the first trenches one by one.

The step of forming the first and second trenches in a semiconductor substrate includes forming a number of first auxiliary patterns arranged in a matrix form over the semiconductor substrate. The matrix is defined by first auxiliary patterns that are spaced apart from each other at a first interval and are arranged in a same column, and first auxiliary patterns that are spaced apart from each other at a second interval and are arranged in a same row. The step also includes forming a second auxiliary pattern on sidewalls of each of the first auxiliary patterns, wherein the second auxiliary patterns are coupled together between the first auxiliary patterns arranged in the same column, removing the first auxiliary patterns, forming third auxiliary patterns over one or more of portions where the second auxiliary patterns are coupled together, etching the semiconductor substrate through an etch process using the second auxiliary patterns and the third auxiliary patterns as an etch mask to form the first and second trenches, and removing the second auxiliary and third auxiliary patterns.

The first interval preferably is at least 1.5 times a width of the first auxiliary pattern and no more than 2 times a width of the second auxiliary pattern.

The second interval preferably is wider than the first interval.

Preferably, two or more second trenches are arranged between the first trenches.

The method preferably further includes, after the step of forming the first and second isolation structures, injecting an impurity ion into the discontinuous region of the second trench to form a source region or a well pickup region.

According to another aspect of this disclosure, a method of manufacturing a flash memory device includes forming a number of first auxiliary patterns arranged in a matrix form over a semiconductor substrate, forming second auxiliary patterns separated from each other in a space between the first auxiliary patterns arranged in a same column, wherein each of the second auxiliary patterns is formed on sidewalls of each of the first auxiliary patterns such that the second auxiliary patterns are separated from each other in a space between the first auxiliary patterns arranged in a same row, removing the first auxiliary patterns, forming a third auxiliary pattern blocking a space between the second auxiliary patterns arranged in a same column, etching the semiconductor substrate through an etch process using the second and third auxiliary patterns as an etch mask to form trenches arranged in a matrix, and forming isolation structures within the respective trenches.

The third auxiliary pattern preferably is formed in a line fashion to intersect the second auxiliary patterns arranged in the same column.

The method may further include, after the step of forming the isolation structures, injecting impurity ion into a space between the isolation structures to form a source region or a well pickup region.

Additional features of the disclosed invention may become apparent to those skilled in the art from a review of the following detailed description, taken in conjunction with the drawings, and the appended claims.

BRIEF DESCRIPTION OF THE DRAWINGS

For a more complete understanding of the disclosure, reference should be made to the following detailed description and accompanying drawings wherein.

Figure 1:
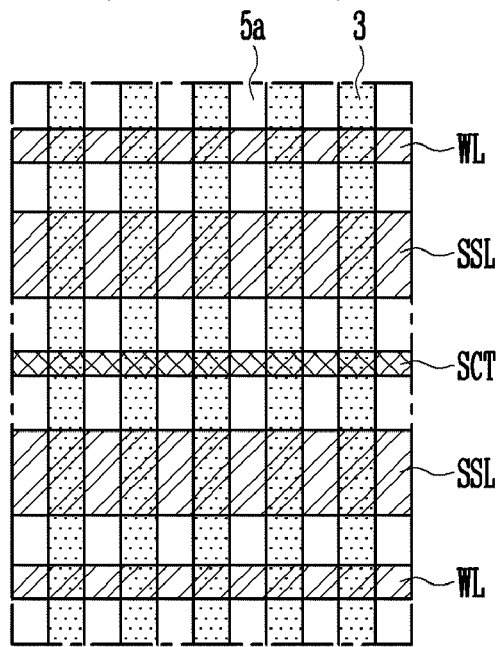
FIG. 1 is a layout diagram showing the active regions and the isolation regions of a known flash memory device.
Figure 2A:
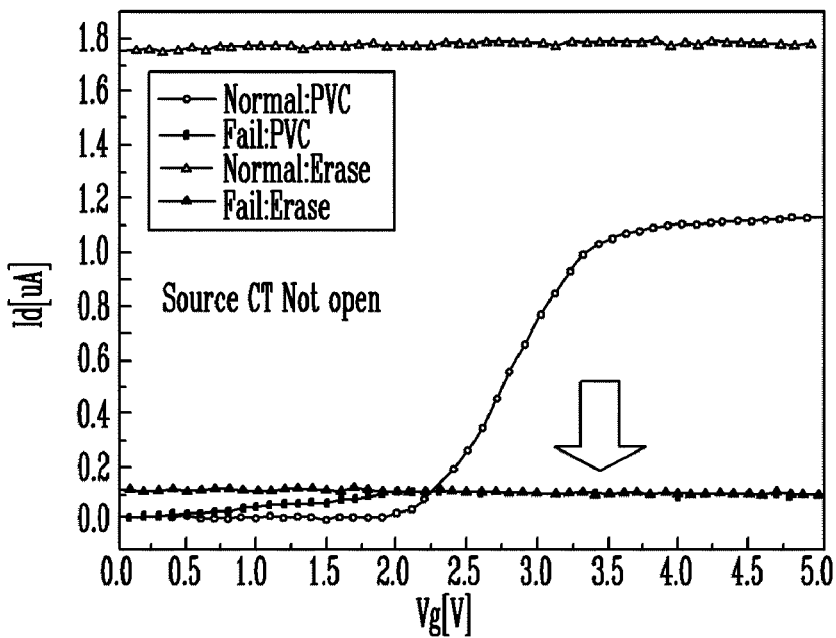
FIGS. 2A and 2B are diagrams illustrating problems resulting from a reduction in the area of a source region.
Figure 2B:
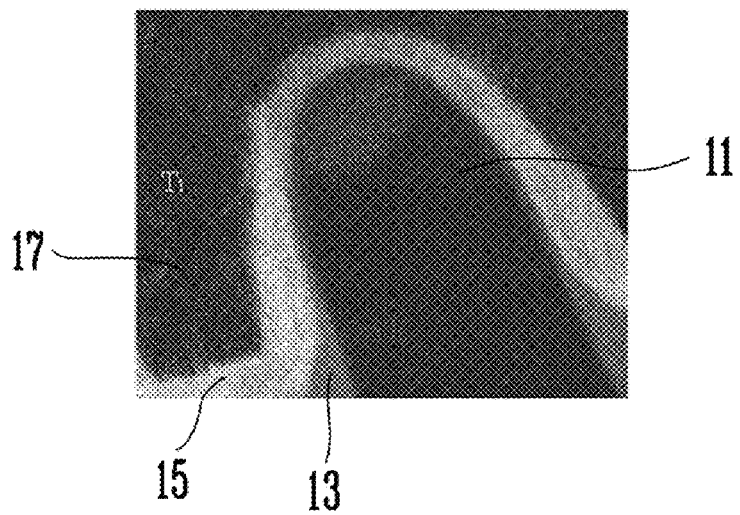
Figure 3:
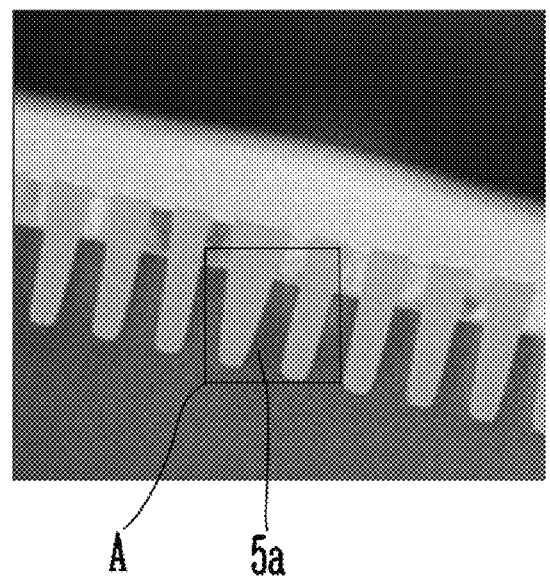
FIG. 3 is a diagram illustrating a problem resulting from a narrowed active region.

While the disclosed device and method are susceptible of embodiments in various forms, there are illustrated in the drawings (and will hereafter be described) specific embodiments, with the understanding that the disclosure is intended to be illustrative, and is not intended to limit the invention to the specific embodiments described and illustrated herein.

DETAILED DESCRIPTION

Hereinafter, embodiments of the present disclosure will be described in detail with reference to the accompanying drawings. The drawing figures are provided to allow those having ordinary skill in the art to understand the scope of the embodiments of the disclosure.

A cell array of a flash memory device according to the embodiments of this disclosure is formed over a semiconductor substrate including active regions and isolation regions having trenches or isolation structures formed therein. The isolation regions and the active regions are alternately defined in parallel.

Furthermore, the cell array of the flash memory device according to the embodiments includes string structures arranged in a matrix form. Each of the string structures includes a drain select transistor having a drain coupled to a bit line, a source select transistor having a source coupled to a common source line, and a number (or plurality) of memory cells coupled in series between the drain select transistor and the source select transistor. The gates of the string structures arranged in parallel are coupled to form gate lines. The gate lines include a drain select line to which the gates of the drain select transistors are coupled, a source select line to which the gates of the source select transistors are coupled, and word lines to each of which the gates of the memory cells are coupled. Such a gate line is formed by coupling the control gates of stacked gates in each of which a floating gate, a dielectric layer, and the control gate are stacked.

Junctions are formed in the active regions between the word lines and the select lines, including the drain select line and the source select line. Here, the junction formed between the drain select lines becomes a drain region, and a drain contact plug is coupled to the drain region. Meanwhile, the junction formed between the source select lines becomes a source region, and a source contact line is coupled to the source region. Here, the drain region and the drain contact plug are coupled together in a one-to-one manner, and the source contact line couples a number of the source regions. That is, the source regions are supplied with a common signal through the source contact line. Thus, although neighboring source regions are coupled together, they do not influence driving of the flash memory device. In one or more embodiments, in order to increase the area of the active region and distribute stress applied to the active region, at least two source regions each provided between the source select lines are coupled together. Thus, the area of the source region, a contact area of the source region, and the source contact line can be increased. The source region constructed, as described above, is defined by the structure of a trench. Accordingly, if it is sought to couple at least two source regions provided over the source select lines, the trenches formed in the isolation regions preferably have a structure in which they are isolated from each other between the source select lines. As a method of forming the trenches having the above structure, there is a method using photoresist patterns as etch barriers. Here, the photoresist patterns preferably include first patterns lengthily formed in a line fashion and not lengthily formed in a line fashion and second patterns each coupling two or more of the first patterns in a vertical direction to the first patterns between the first patterns. That is, the second pattern preferably is formed to couple the first patterns that are repeatedly formed. However, a fail is prone to occur at the intersections of the first and second patterns of the photoresist patterns because of limited exposure resolutions. In particular, in the case where a photoresist pattern must have a critical line width according to the high integration of semiconductor devices, a fail of the photoresist pattern becomes worse, thereby causing a driving fail in a flash memory device. It makes it difficult to form trenches isolated from each other between the source select lines using photoresist patterns.

Accordingly, one or more embodiments of this disclosure provide a method of manufacturing a flash memory device that is capable of overcoming limited exposure resolutions and easily forming trenches isolated from each other between source select lines.

Figure 4A:
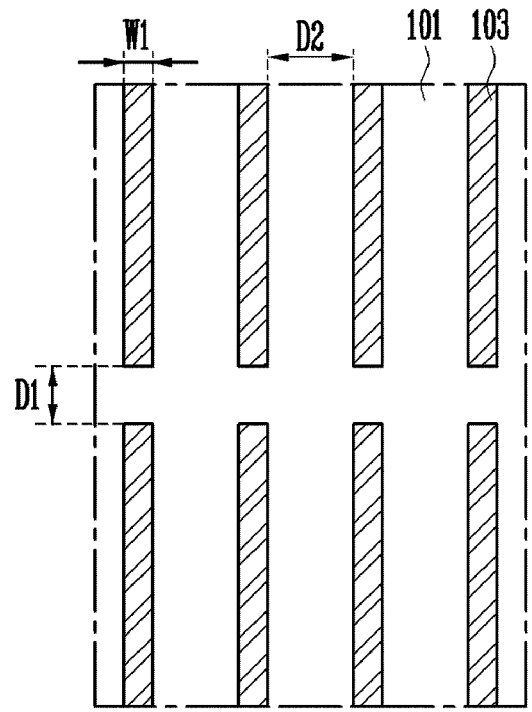
FIGS. 4A to 4E are layout diagrams illustrating a method of manufacturing a flash memory device according to a first embodiment.
Figure 4B:
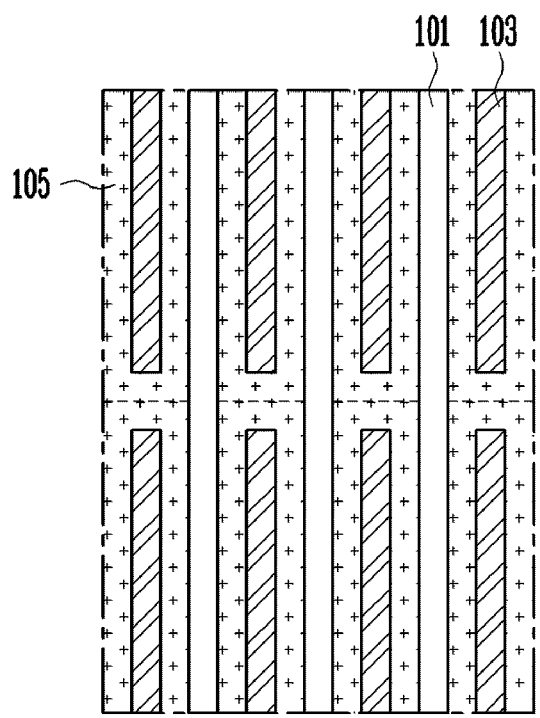
Figure 4C:
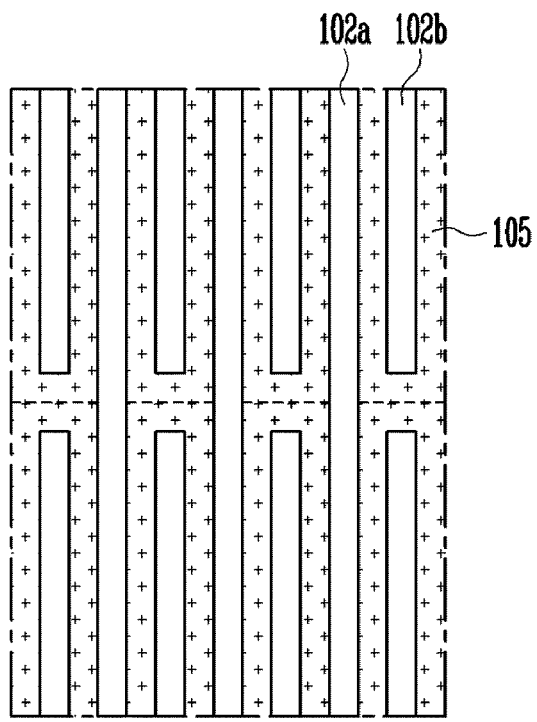
Figure 4D:
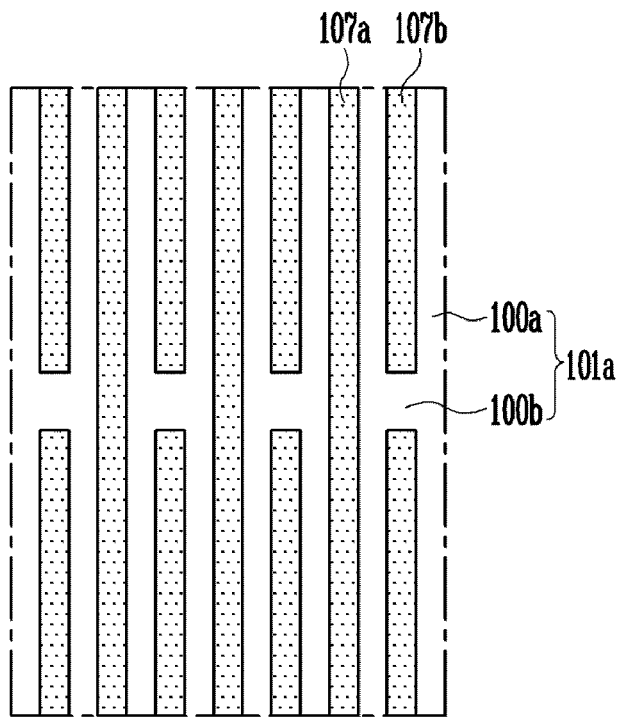
Figure 4E:
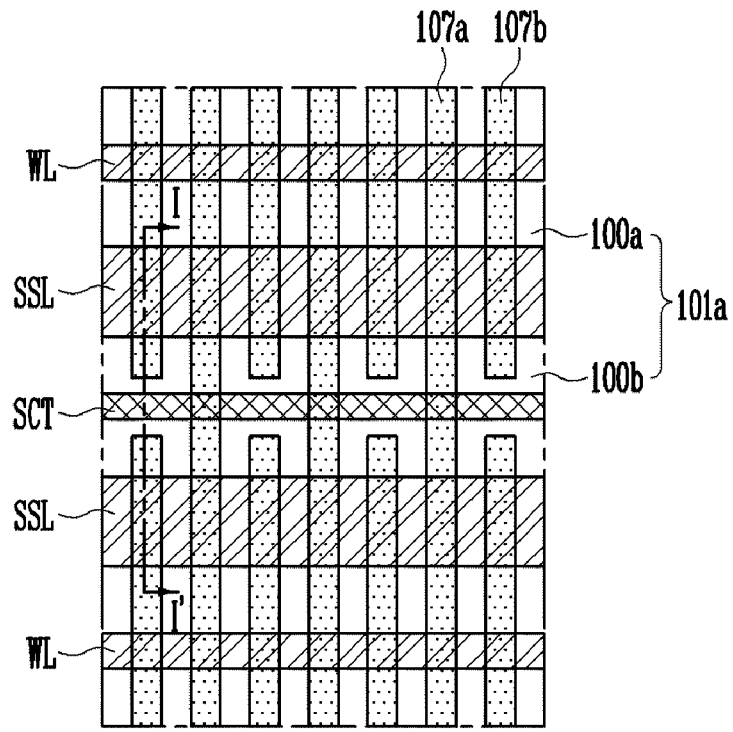
Figure 5:
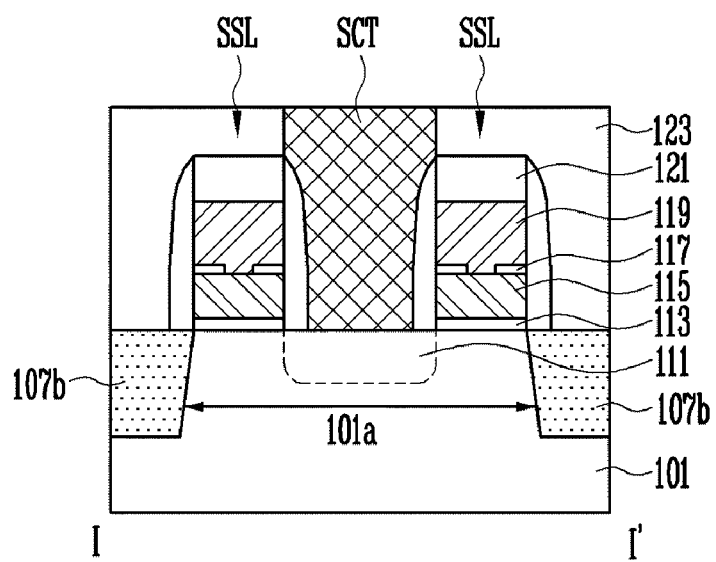
FIG. 5 is a cross-sectional view of the flash memory device taken along line I-I' in FIG. 4E.

FIGS. 4A to 4E are layout diagrams illustrating a method of manufacturing a flash memory device according to a first embodiment, and FIG. 5 is a cross-sectional view of the flash memory device taken along line I-I' in FIG. 4E.

Referring to FIG. 4A, first auxiliary patterns 103 are formed over a semiconductor substrate 101. The first auxiliary pattern 103 is used to define the interval between second auxiliary patterns which will be formed on the sidewalls of the first auxiliary pattern 103 in a subsequent process.

A number (plurality) of the first auxiliary patterns 103 are formed over the semiconductor substrate. A number of the first auxiliary patterns 103 are separated from each other and arranged in a matrix form. Here, the interval between the first auxiliary patterns 103 arranged in the same column is set to a first interval D1 such that the second auxiliary patterns to be formed in a subsequent process can be coupled together. In more detail, the first interval D1 preferably is set to 2 times or less (no more than 2 times) the width of the second auxiliary pattern. Furthermore, the interval between the first auxiliary patterns 103 arranged in the same row is set to a second interval D2, which is wider than the first interval D1, such that the second auxiliary patterns to be formed in a subsequent process can be sufficiently separated from each other.

The first interval D1 defines the interval between second trenches that will be arranged in the same column in a subsequent process. The interval between the second trenches arranged in the same column is defined in order to increase the area of an active region. The first interval D1 preferably is set to 1.5 times or more (at least 1.5 times) the width W1 of the first auxiliary pattern 103. Accordingly, the first interval D1 is set to 1.5 times or more the width W1 of the first auxiliary pattern 103 and to 2 times or less the width of the second auxiliary pattern.

The first auxiliary patterns 103 may be photoresist patterns formed by a photolithograph process, including exposure and development processes, or may be formed by etching and patterning an auxiliary layer using the photoresist patterns as a mask. Thus, the shapes of the first auxiliary patterns 103 are determined according to the limit of exposure resolutions.

Although not shown, a tunnel insulating layer and a charge trap layer can be further formed between the first auxiliary patterns 103 and the semiconductor substrate 101. A number of auxiliary layers with different etch selectivities can be further formed between the charge trap layer and the first auxiliary patterns 103 in order to stably perform etch processes that are repeatedly performed in this disclosure. The charge trap layer can be made of a conductive material for floating gates, such as polysilicon.

Referring to FIG. 4B, the second auxiliary patterns 105 are formed on the sidewalls of the first auxiliary patterns 103. The second auxiliary patterns 105 define regions where the active regions and the first and second trenches will be formed.

The second auxiliary patterns 105 are coupled together in the space between the first auxiliary patterns 103 arranged in the same column and are separated from each other in the space between the first auxiliary patterns 103 arranged in the same row. This is possible because, as described above with reference to FIG. 4A, the second interval D2 is set to the first interval D1 or more and the second interval D2 is set to 2 times or less the width of the second auxiliary pattern 105.

The width of the second auxiliary pattern 105 is determined according to the thickness of the second auxiliary pattern 105 formed on the sidewalls of the first auxiliary pattern 103, thereby being capable of overcoming the limit of exposure resolutions.

Referring to FIG. 4C, after forming the second auxiliary patterns 105, the first auxiliary patterns 103 are removed. Next, the semiconductor substrate is etched by an etch process using the second auxiliary patterns 105 as a mask. Thus, first trenches 102a and second trenches 102b are alternately formed in the column direction.

The first trenches 102a are formed side by side and in parallel. The second trench 102b each having a length shorter than that of the first trenches 102a are formed between the first trenches 102a. That is, the second trenches 102b are arranged in a line with the second auxiliary pattern 105 interposed therebetween between the first trenches 102a.

The second trenches 102b are discontinuous in a predetermined region and are arranged in the same direction as the first trenches 102a between the first trenches 102a.

Although not shown, when performing the etch process using the second auxiliary patterns as a mask, the charge trap layer and the tunnel insulating layer which are etched may remain over the active regions 101a. After patterning the remaining charge trap layer, the second auxiliary patterns are removed.

Referring to FIG. 4D, the insides of each of the first and second trenches are filled with an insulating material to thereby form first and second isolation structures 107a, 107b. Accordingly, the isolation structures are formed, and the active regions 101a having the same shape as the second auxiliary patterns 105 are defined.

The first isolation structures 107a are respectively formed within the first trenches 102a, and the second isolation structures 107b are respectively formed within the second trenches 102b. Thus, each of the second isolation structures 107b has a length shorter than that of the first isolation structure 107a between the first isolation structures 107a.

Since the active regions 101a have the same shape as the second auxiliary patterns 105, they can also be defined in the semiconductor substrate between the second isolation structures 107b arranged in a line. In more detail, the active region 101a includes first patterns 100a which are formed long, narrowly, and side by side. The active region 101a further includes a second pattern 100b that is configured to couple the first patterns 100a and is formed in the semiconductor substrate between the second isolation structures 107b. That is, the first patterns 100a of the active region 101a are coupled together by the second pattern 100b formed in a predetermined region. Consequently, in the first embodiment of this disclosure, the area of the active region 101a can be increased as much as the area of the second pattern 100b. Furthermore, in the first embodiment of this disclosure, since stress applied to the first patterns 100a that are formed long and narrowly can be distributed in the second pattern 100b, a bend phenomenon of the active region 101a can be improved.

Referring to FIGS. 4E and 5, gate lines, including word lines WL, source select lines SSL, and drain select lines (not shown), are formed over the semiconductor substrate in which the active regions 101a and the isolation structures 107a, 107b are formed. The gate lines are formed to intersect the first and second isolation structures 107a, 107b.

The gate lines can be formed by stacking a dielectric layer 117, a conductive material 119 for control gates, and a gate hard mask 121 over the semiconductor substrate 101, including the active regions 101a, the isolation structures 107, a tunnel insulating layer 113, and a charge trap layer 115, and then patterning the conductive material 119 for control gates and the dielectric layer 117 by an etch process using the gate hard mask 121 as an etch mask.

The dielectric layer 117 formed over a region in which the source select line SSL and the drain select line will be formed includes a contact hole through which the charge trap layer 115 is exposed. The charge trap layer 115 and the source select line SSL, and the charge trap layer 115 and the drain select line can be electrically coupled together through the contact hole formed in the dielectric layer 117 as described above.

The conductive material 119 for control gates can be formed of a single layer made of polysilicon, a stack layer of polysilicon and tungsten silicide, or a stack layer of polysilicon and a tungsten layer.

In the case where the charge trap layer 115 is stacked between the conductive material 119 for control gates and the active region 101a, the conductive material 119 for control gates and the dielectric layer 117 are patterned and the charge trap layer 115 is then patterned. Alternatively, after patterning the charge trap layer 115, the tunnel insulating layer 113 may be patterned. Thus, gates in each of which the tunnel insulating layer 113, the charge trap layer 115, the dielectric layer 117, and the control gate 119 are stacked over the active region 101a are formed. Here, the source select lines SSL are formed to face each other with the second pattern 100b interposed therebetween.

Next, junctions 111 are formed in the active regions 101a of the semiconductor substrate 101 by injecting impurity ions using the gate lines as a mask. The junctions 111 include a source region formed in the active region 101a between the source select lines SSL and a drain region formed in the active region 101a between the drain select lines. In particular, the predetermined region of the semiconductor substrate 101 provided between the second trenches 102b becomes the source region.

A spacer can be further formed on both sidewalls of the stacked gate in order to prevent the stacked gates from being exposed in a subsequent process to form the contact holes.

A dielectric interlayer 123 providing insulation between the gate lines WL, SSL is formed over the semiconductor substrate 101 including the junctions 111.

The dielectric interlayer 123 is etched to form a source contact hole exposing the junction 111 between the source select lines SSL, and the source contact hole is filled with a conductive material to thereby form a source contact line SCT. Thus, the source contact line SCT is coupled to the source regions through the dielectric interlayer 123. The source contact line SCT couples the junctions 111 in a line fashion which are formed in a line between the source select lines SSL.

As described above, in the first embodiment of this disclosure, since the area of the active region 101a can be increased as much as the area of the second pattern 100b, the area of the source region formed in the active region 101a can also be increased. Accordingly, in the first embodiment of this disclosure, the contact resistance (Rc) of the source contact line SCT and the source region can be improved.

Furthermore, in the first embodiment of this disclosure, the area of the active region 101a can be increased using the second auxiliary pattern formed on the sidewalls of the first auxiliary pattern. The second auxiliary pattern is not formed by exposure and development processes, and so it can overcome the limit of exposure resolutions and increase the area of the active region 101a.

Figure 6A:
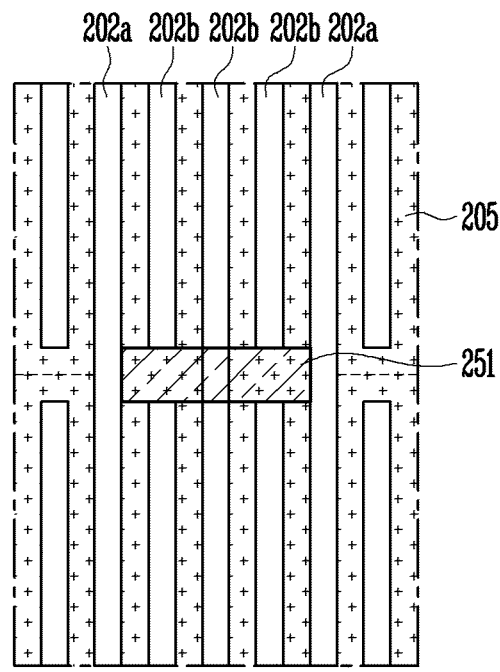
FIGS. 6A and 6B are layout diagrams illustrating a method of manufacturing a flash memory device according to a second embodiment.
Figure 6B:
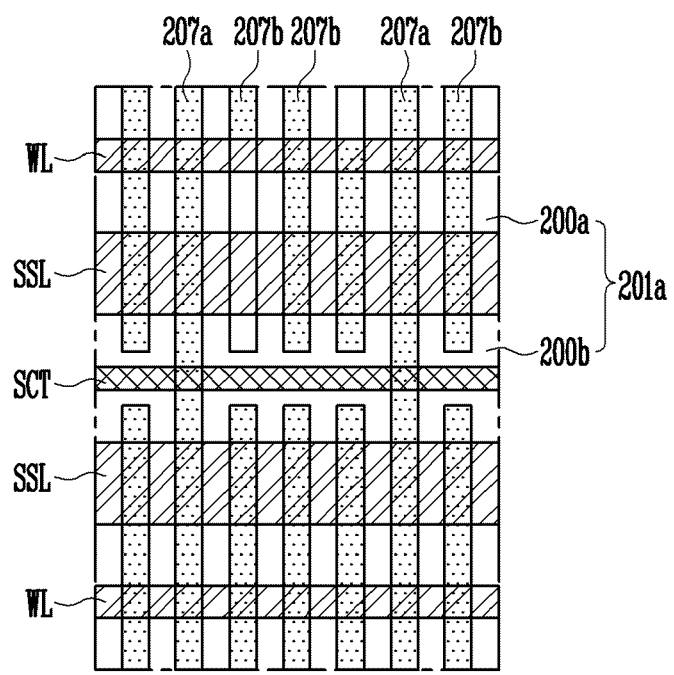

FIGS. 6A and 6B are layout diagrams illustrating a method of manufacturing a flash memory device according to a second embodiment.

Referring to FIG. 6A, in the method of manufacturing a flash memory device according to the second embodiment, second auxiliary patterns 205 are formed and first auxiliary patterns are removed using the same method as that described with reference to FIGS. 4A to 4C. A third auxiliary pattern 251 precluding the space between the neighboring second auxiliary patterns 205 is formed. First and second trenches 202a, 202b are formed by etching a semiconductor substrate through an etch process using the second and third auxiliary patterns 205, 251 as an etch mask.

The first trenches 202a are formed side by side and in parallel. Two or more second trenches 202b each having a length shorter than that of the first trench 202a are arranged between the first trenches 202a. That is, two or more columns of the second trenches 202b are arranged between the first trenches 202a with the second auxiliary pattern 205 or the third auxiliary pattern 251 interposed therebetween.

The second trenches 202b are discontinuous in a predetermined region and are arranged in the same direction as the first trenches 202a between the first trenches 202a.

Referring to FIG. 6B, after removing the second and third auxiliary patterns, first and second isolation structures 207a, 207b, gate lines, junctions, and a source contact line SCT are formed using the same method as that described with reference to FIGS. 4D and 4E.

In the second embodiment of this disclosure, the first isolation structures 207a are respectively formed within the first trenches, and the second isolation structures 207b are respectively formed within the second trenches. Consequently, the second isolation structure 207b has a length shorter than that of the second isolation structure 207a between the first isolation structures 207a, and two or more columns of the second isolation structures 207b are arranged.

Meanwhile, in the second embodiment of this disclosure, active regions 201a can be defined in the semiconductor substrate between the two or more columns of the second isolation structures 207b. In more detail, the active region 201a include first patterns 200a that are formed long, narrow, and side by side and a second pattern 200b that couples two or more first patterns 200a. That is, the first patterns 200a of the active region 201a are coupled together by the second pattern 200b formed in a predetermined region. Meanwhile, in the second embodiment of this disclosure, since two or more first patterns 200a are coupled together by the second pattern 200b, the area of the active region 201a can be further increased as compared to the first embodiment of this disclosure. Furthermore, in the second embodiment of this disclosure, since stress applied to the first patterns 200a that are formed long and narrowly can be distributed in the second pattern 200b, a bend phenomenon of the active region 201a can be improved.

FIGS. 7A to 7E are layout diagrams illustrating a method of manufacturing a flash memory device according to a third embodiment.

Figure 7A:
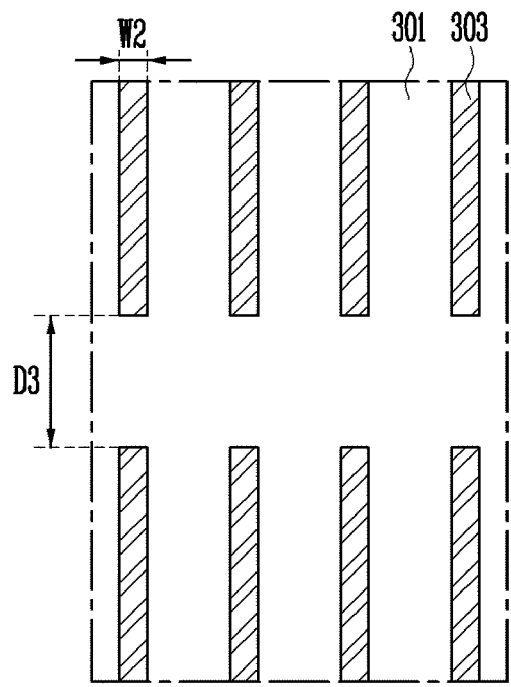
FIGS. 7A to 7E are layout diagrams illustrating a method of manufacturing a flash memory device according to a third embodiment.

Referring to FIG. 7A, first auxiliary patterns 303 are formed over a semiconductor substrate 301 as described above with reference to FIG. 4A. That is, a number (plurality) of the first auxiliary patterns 303 are formed over the semiconductor substrate 301, and are separated from each other and arranged in a matrix form.

In the third embodiment of this disclosure, the space between the first auxiliary patterns 303 arranged in the same column is wider than that in the first embodiment of this disclosure. That is, the space between the first auxiliary patterns 303 arranged in the same column is set to a third interval D3 such that second auxiliary patterns to be formed in a subsequent process can be separated from each other. The third interval D3 is wider than the first interval D1 of FIG. 4A. That is, the third interval D3 is at least 2 times the width W2 of the first auxiliary pattern 303. Here, an interval between the first auxiliary patterns 303 arranged in the same row can be identical to the third interval D3.

Figure 7B:
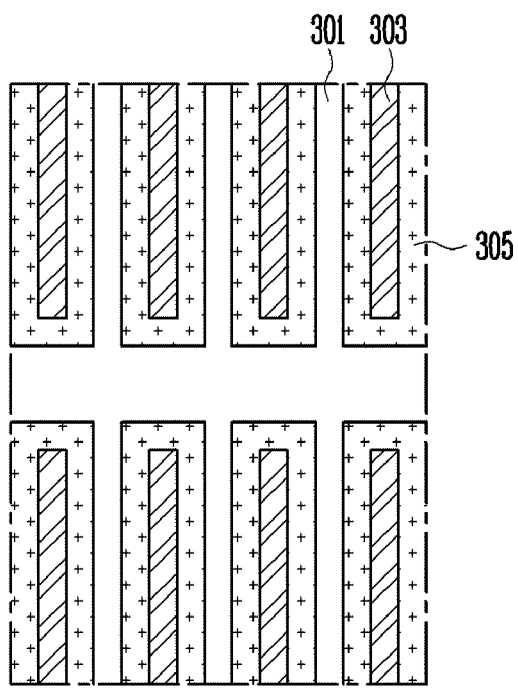

Referring to FIG. 7B, a second auxiliary pattern 305 is formed on the sidewalls of each of the first auxiliary patterns 303. The second auxiliary patterns 305 according to the third embodiment are separated from each other in the space between the first auxiliary patterns 303 arranged in the same column and are also separated from each other in the space between the first auxiliary patterns 303 arranged in the same row.

Figure 7C:
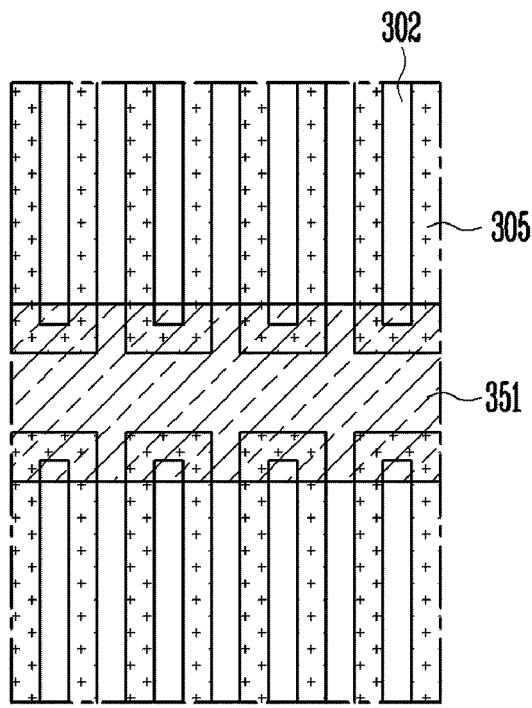

Referring to FIG. 7C, after forming the second auxiliary patterns 305, the first auxiliary patterns 303 are removed.

Next, a third auxiliary pattern 351 blocking the space between the second auxiliary patterns 305 arranged in the same column is formed. The third auxiliary pattern 351 is formed in a line fashion to intersect the second auxiliary patterns 305. Here, the third auxiliary pattern 351 can be a photoresist pattern that is patterned using exposure and development processes or can be formed by patterning an auxiliary layer using the photoresist patterns. Although the third auxiliary pattern 351 is the photoresist pattern, it is formed separately from photoresist patterns for forming the first auxiliary patterns 303. Thus, the third auxiliary pattern 351 can be stably formed because process margin can be secured.

Trenches 302 are formed by etching the semiconductor substrate through an etch process using the second auxiliary patterns 305 and the third auxiliary pattern 351 as an etch mask. The trenches 302 are separated from each other and arranged in a matrix form.

The second auxiliary patterns 305 and the portion blocked by the third auxiliary pattern 351 are defined as active regions in a subsequent process.

After forming the trenches 302, the second auxiliary patterns 305 and the third auxiliary pattern 351 are removed.

Figure 7D:
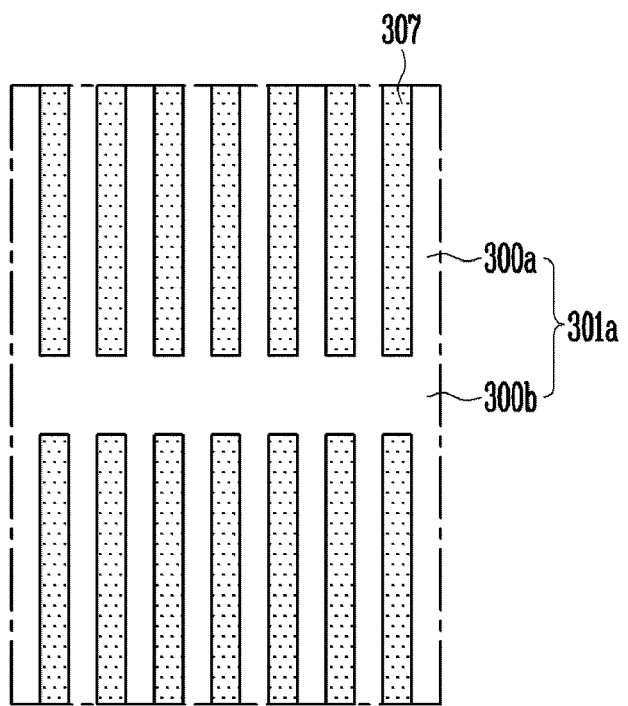

Referring to FIG. 7D, the insides of each of the trenches are filled with an insulating material to thereby form isolation structures 307 in the respective trenches. Thus, the isolation structures are formed, and the active region 301a is defined.

The isolation structures 307 are formed within the trenches, separated from each other, and are arranged in a matrix form.

The active region 301a can also be defined between the isolation structures 307 arranged in the same column because it is formed in the second auxiliary patterns 305 and the portion blocked by the third auxiliary pattern 351. In more detail, the active region 301a includes first patterns 300a that are formed lengthily, narrowly, and side by side. The active region 301a further includes a second pattern 300b that is configured to couple all the first patterns 300a and formed in the semiconductor substrate between the isolation structures 307. Consequently, in the third embodiment of this disclosure, the area of the active region 301a can be increased as much as the area of the second pattern 300b and further increased as compared to the first and second embodiments of this disclosure. Furthermore, in the third embodiment of this disclosure, since stress applied to the first pattern 300a that is formed lengthily and narrowly can be distributed in the second pattern 300b, a bend phenomenon of the active region 301a can be improved.

Figure 7E:
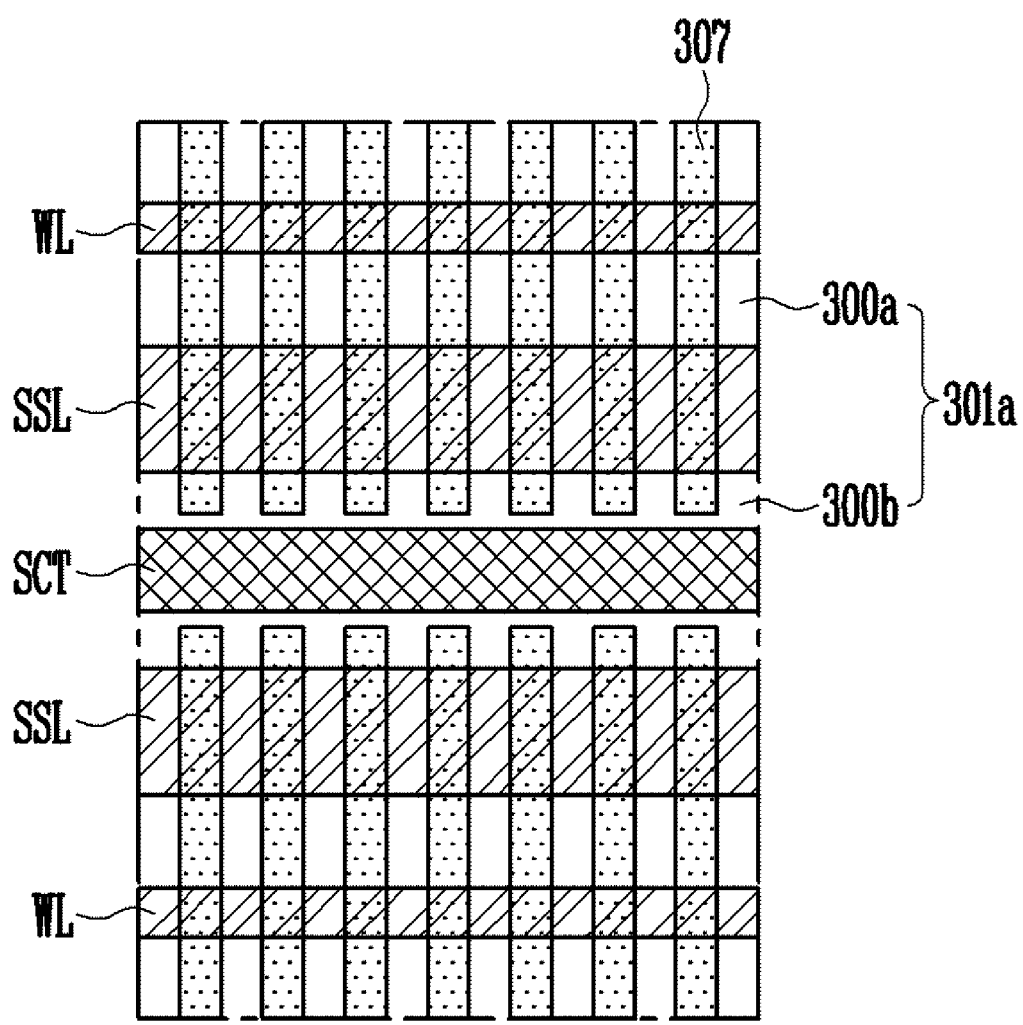

Referring to FIG. 7E, after removing the second and third auxiliary patterns, gate lines, junctions, and a source contact line SCT are formed using the same method as that described above with reference to FIGS. 4D and 4E.

In the third embodiment of this disclosure, since the area of the second pattern 300b can be increased as much as the area of a source region, the contact resistance (Rc) of the source contact line SCT and the source region can be improved.

In the third embodiment of this disclosure, the interval between the first auxiliary patterns arranged in the same column is wide as compared to the first embodiment, such that the second auxiliary patterns arranged in the same column can be separated from each other. Furthermore, the space between the second auxiliary patterns arranged in the same column is blocked by the third auxiliary pattern having a line fashion. Accordingly, in the third embodiment of this disclosure, the area of the second pattern of the active region is defined by the third auxiliary pattern and the space between the second auxiliary patterns arranged in the same column, and the area of the second pattern therefore can be wide as compared to the first embodiment.

Furthermore, in the third embodiment of this disclosure, the second auxiliary pattern is not formed by exposure and development processes, and the third auxiliary pattern is formed separately from the first auxiliary patterns that are repeatedly formed. Accordingly, in the third embodiment of this disclosure, the limit of exposure resolutions can be overcome, and the active regions can be stably coupled together.

In the first to third embodiments of this disclosure, the active regions of a cell region are not lengthily formed side by side in a line fashion, but two or more active regions are coupled together. Thus, the area of a source region can be increased up to three times or more as compared to known technologies. Furthermore, in the first to third embodiments of this disclosure, stress applied to the active regions can be reduced because the active regions are lengthily formed side by side in a line fashion and coupled together. Since the area of the source region can be increased up to three times or more, the first to third embodiments of this disclosure can reduce the contact resistance (Rc) of the source region and the source contact line by ⅓ times or more as compared to known technologies. Moreover, since stress applied to the active regions can be reduced, the first to third embodiments of this disclosure can improve a bend phenomenon of the active regions.

Although an example in which the contact resistance of the source region and the source contact line is improved has been described above, the present disclosure is not limited to the example, but can be used to improve the contact resistance of a well pickup region and a well pickup contact plug.

The well pickup region and the well pickup contact plug are formed to improve the threshold voltage (Vth) by applying a well bias voltage to a semiconductor substrate and also stabilize the electrical properties of elements formed over the semiconductor substrate. The well pickup region is formed by injecting impurity ions into an active region. The well pickup contact plug can be formed by forming a dielectric interlayer, including a well pickup contact hole exposing the well pickup region, over the semiconductor substrate including the well pickup region and gate lines and then filling the inside of the well pickup contact hole with a conductive material. The well pickup region is also formed in the active region like the source region. Accordingly, the area of the well pickup region can be increased using the predetermined region of the semiconductor substrate, provided between the second trenches, as the well pickup region like the source region according to the embodiments of this disclosure. Consequently, the contact resistance of the well pickup contact plug and the well pickup region can be improved.

According to the present disclosure, the area of the active region can be increased as much as the area of the second pattern through the second pattern coupling two or more first patterns that are lengthily formed side by side and in parallel. Furthermore, since stress applied to the active region is distributed in the second pattern, stress of the active region can be reduced.

In the present disclosure, since the area of the active region can be secured as much as the area of the second pattern, the contact resistance (Rc) of the source region and the source contact line or the contact resistance of the well pickup region and the well pickup contact plug can be reduced as compared to known technologies.

The present disclosure can improve a bend phenomenon of the active region because stress of the active region is distributed in the second pattern and reduced.

Furthermore, in the present disclosure, in forming a structure in which the active regions formed lengthily and side by side are coupled by a pattern vertical to the active regions, the second auxiliary pattern formed on the sidewalls of each of the first auxiliary patterns or the third auxiliary pattern formed by an additional process is used. The second auxiliary patterns are not formed by exposure and development processes, and the third auxiliary pattern is formed separately from the first auxiliary patterns that are repeatedly formed. Accordingly, the limit of exposure resolutions can be overcome and two or more active regions can be stably coupled together using the second auxiliary patterns or the third auxiliary pattern.

What is claimed is:

1. A method of manufacturing a flash memory device, the method comprising:
    forming first auxiliary patterns arranged in a matrix form over a semiconductor substrate, wherein the matrix is defined by the first auxiliary patterns that are spaced apart from each other at a first interval and are arranged in a same column, and the first auxiliary patterns are spaced apart from each other at a second interval and are arranged in a same row;
    forming a second auxiliary pattern on sidewalls of each of the first auxiliary patterns;
    removing the first auxiliary patterns;
    etching the semiconductor substrate through an etch process using the second auxiliary patterns as an etch mask to form the first and second trenches in the semiconductor substrate, wherein the first trenches are arranged in parallel, and the second trenches are discontinuously arranged between the first trenches;
    removing the second auxiliary patterns; and
    forming first isolation structures within the respective first trenches and second isolation structures within the respective second trenches, thereby defining active regions by the first isolation structures and the second isolation structures.

2. The method of claim 1, wherein the first interval is at least 1.5 times a width of the first auxiliary pattern and no more than 2 times a width of the second auxiliary pattern.

3. The method of claim 2, wherein the second interval is wider than the first interval.

4. The method of claim 1, wherein the second trenches are arranged between the first trenches one by one.

5. The method of claim 1, wherein the second auxiliary patterns are coupled together between the first auxiliary patterns arranged in the same column.

6. A method of manufacturing a flash memory device, the method comprising:
    forming first auxiliary patterns arranged in a matrix form over a semiconductor substrate, wherein the matrix is defined by the first auxiliary patterns that are spaced apart from each other at a first interval and are arranged in a same column, and the first auxiliary patterns are spaced apart from each other at a second interval and are arranged in a same row;
    forming a second auxiliary pattern on sidewalls of each of the first auxiliary patterns, wherein the second auxiliary patterns are coupled together between the first auxiliary patterns arranged in the same column;
    removing the first auxiliary patterns;
    forming third auxiliary patterns over one or more of portions where the second auxiliary patterns are coupled together;
    etching the semiconductor substrate through an etch process using the second auxiliary patterns and the third auxiliary patterns as an etch mask to form first and second trenches in the semiconductor substrate, wherein the first trenches are arranged in parallel, and the second trenches are discontinuously arranged between the first trenches;

removing the second and third auxiliary patterns; and forming first isolation structures within the respective first trenches and second isolation structures within the respective second trenches, thereby defining active regions by the first isolation structures and the second isolation structures.

7. The method of claim 6, wherein the first interval is at least 1.5 times a width of the first auxiliary pattern and no more than 2 times a width of the second auxiliary pattern.

8. The method of claim 7, wherein the second interval is wider than the first interval.

9. The method of claim 6, wherein two or more second trenches are arranged between the first trenches.

10. The method of claim 6, further comprising, after the step of forming the first and second isolation structures, injecting an impurity ion into the active region between the second trench to form a source region or a well pickup region.

11. A method of manufacturing a flash memory device, the method comprising:

forming a number of first auxiliary patterns arranged in a matrix form over a semiconductor substrate;

forming second auxiliary patterns separated from each other in a space between the first auxiliary patterns arranged in a same column, wherein each of the second auxiliary patterns is formed on sidewalls of each of the first auxiliary patterns such that the second auxiliary patterns are separated from each other in a space between the first auxiliary patterns arranged in a same row;

removing the first auxiliary patterns;

forming a third auxiliary pattern blocking a space between the second auxiliary patterns arranged in a same column;

etching the semiconductor substrate through an etch process using the second and third auxiliary patterns as an etch mask to form trenches arranged in a matrix; and forming isolation structures within the respective trenches.

12. The method of claim 11, wherein the third auxiliary pattern is formed in a line fashion to intersect the second auxiliary patterns arranged in the same column.

13. The method of claim 11, further comprising, after the step of forming the isolation structures, injecting impurity ion into a space between the isolation structures to form a source region or a well pickup region.

* * * * *